(12) United States Patent
Banerjee et al.

(10) Patent No.: US 8,487,646 B2
(45) Date of Patent: *Jul. 16, 2013

(54) METHOD AND APPARATUS FOR READING A PROGRAMMABLE ANTI-FUSE ELEMENT IN A HIGH-VOLTAGE INTEGRATED CIRCUIT

(75) Inventors: Sujit Banerjee, San Jose, CA (US); Giao Minh Pham, Milpitas, CA (US)

(73) Assignee: Power Integrations, Inc., San Jose, CA (US)

( * ) Notice: Subject to any disclaimer, the term of this patent is extended or adjusted under 35 U.S.C. 154(b) by 117 days.

This patent is subject to a terminal disclaimer.

(21) Appl. No.: 13/066,624

(22) Filed: Apr. 20, 2011

(65) Prior Publication Data

US 2011/0276292 A1 Nov. 10, 2011

Related U.S. Application Data

(63) Continuation of application No. 12/800,054, filed on May 7, 2010, now Pat. No. 7,932,738.

(51) Int. Cl.
*G01R 31/02* (2006.01)
(52) U.S. Cl.
USPC .................................. 324/762.01; 365/225.7
(58) Field of Classification Search
USPC ........... 324/762.01, 762.02, 750.3; 365/225.7
See application file for complete search history.

(56) References Cited

U.S. PATENT DOCUMENTS

| | | | |
|---|---|---|---|
| 5,282,107 A | 1/1994 | Balakrishnan | |
| 5,285,369 A | 2/1994 | Balakrishnan | |
| 5,977,763 A | 11/1999 | Loughmiller et al. | |
| 6,388,853 B1 | 5/2002 | Balakrishnan et al. | |
| 6,449,207 B2 | 9/2002 | Sher et al. | |
| 6,630,724 B1 | 10/2003 | Marr | |
| 6,635,544 B2 | 10/2003 | Disney | |
| 6,640,435 B2 | 11/2003 | Balakrishnan | |
| 6,668,451 B2 | 12/2003 | Balakrishnan | |
| 6,693,481 B1 * | 2/2004 | Zheng | 327/525 |
| 6,750,640 B2 | 6/2004 | Balakrishnan et al. | |
| 6,954,057 B2 | 10/2005 | Balakrishnan et al. | |
| 6,987,299 B2 | 1/2006 | Disney et al. | |
| 7,002,398 B2 | 2/2006 | Disney | |
| 7,170,756 B2 | 1/2007 | Balakrishnan | |
| 7,205,824 B2 | 4/2007 | Disney | |
| 7,221,011 B2 | 5/2007 | Banerjee et al. | |
| 7,227,733 B2 | 6/2007 | Balakrishnan et al. | |
| 7,308,754 B2 | 12/2007 | Balakrishnan | |
| 7,335,944 B2 | 2/2008 | Banerjee et al. | |
| 7,336,095 B2 | 2/2008 | Erickson et al. | |
| 7,400,483 B2 | 7/2008 | Balakrishnan et al. | |
| 7,932,738 B1 | 4/2011 | Banerjee et al. | |
| 7,998,817 B2 | 8/2011 | Disney | |

(Continued)

*Primary Examiner* — Arleen M Vazquez
(74) *Attorney, Agent, or Firm* — The Law Offices of Bradley J. Bereznak

(57) ABSTRACT

In a method for reading a programmable anti-fuse block of a high-voltage integrated circuit a first voltage is applied to a first pin of the HVIC, the first voltage being lowered to a second voltage at a first node. Current is shunted from the first node, thereby lowering the second voltage to a third voltage. An isolation circuit block is then activated to couple the third voltage to a common node of the programmable anti-fuse block, the common node being coupled to a plurality of anti-fuses, each anti-fuse having a programmed state. A read signal is generated that causes a voltage potential representative of the programmed state of each anti-fuse to be latched into a corresponding latch element.

15 Claims, 3 Drawing Sheets

U.S. PATENT DOCUMENTS

| | | | |
|---|---|---|---|
| 2006/0092742 A1* | 5/2006 | Paillet et al. | 365/225.7 |
| 2010/0163990 A1 | 7/2010 | Ko | |
| 2010/0301412 A1 | 12/2010 | Parthasarathy et al. | |
| 2011/0272758 A1 | 11/2011 | Banerjee et al. | |

* cited by examiner even, persons having ordinary skill in the relevant arts will
METHOD AND APPARATUS FOR READING A PROGRAMMABLE ANTI-FUSE ELEMENT IN A HIGH-VOLTAGE INTEGRATED CIRCUIT This application is a continuation of application Ser. No. 12/800,054, filed May 7, 2010, now U.S. Pat. No. 7,932,738, entitled, "METHOD AND APPARATUS FOR READING A PROGRAMMABLE ANTI-FUSE ELEMENT IN A HIGH-VOLTAGE INTEGRATED CIRCUIT", which is assigned to the assignee of the present application.

TECHNICAL FIELD

The present disclosure generally relates to a circuit for reading one or more anti-fuse elements in a high-voltage integrated circuit.

BACKGROUND

A high voltage integrated circuit (IC) may include a metal-oxide-semiconductor field effect transistor (MOSFET) that includes a high-voltage field effect transistor (HVFET). Many HVFETs employ a device structure that includes an extended drain region that supports or "blocks" the applied high-voltage (e.g., 150 volts or more) when the device is in an 'off' state.

The operating characteristics of a high voltage IC are typically set by a method known as trimming. More specifically, trimming may involve selectively closing (or opening) one or more electrical elements to adjust certain characteristics of the high voltage IC. During the process of trimming, one or more anti-fuses may be shorted to set certain operating parameters in the high voltage IC. An anti-fuse is an electrical device that is normally in an 'open' or non-conducting state. To change the state of the anti-fuse to a 'closed' or conducting state, a certain voltage and/or current is applied to breakdown the anti-fuse. After breakdown, a substantial current may pass through the anti-fuse.

By way of example, one or more anti-fuse elements may be utilized to trim or program an analog parameter, e.g., switching frequency in a high voltage IC used in a switch mode power supply. During a start-up condition, the high voltage IC may need to read the state of the anti-fuses to make appropriate adjustments to operate within specified parameters.

BRIEF DESCRIPTION OF THE DRAWINGS

The present disclosure will be understood more fully from the detailed description that follows and from the accompanying drawings, which however, should not be taken to limit the disclosure to the specific embodiments shown, but are for explanation and understanding only.

DESCRIPTION OF EXAMPLE EMBODIMENTS

A method and apparatus for reading one or more programmable anti-fuse elements of a power IC is disclosed. In the following description specific details are set forth, voltages, structural features, manufacturing steps, etc., in order to provide a thorough understanding of the disclosure herein. However, persons having ordinary skill in the relevant arts will appreciate that these specific details may not be needed to practice the embodiments described. References throughout this description to "one embodiment", "an embodiment", "one example" or "an example" means that a particular feature, structure or characteristic described in connection with the embodiment or example is included in at least one embodiment. The phrases "in one embodiment", "in an embodiment", "one example" or "an example" in various places throughout this description are not necessarily all referring to the same embodiment or example. Furthermore, the particular features, structures or characteristics may be combined in any suitable combinations and/or sub-combinations in one or more embodiments or examples.

It should be understood that the elements in the figures are representational, and are not drawn to scale in the interest of clarity. It is also appreciated that although an IC utilizing mostly N-channel transistor devices (both high-voltage and low-voltage) are disclosed, P-channel transistors may also be fabricated by utilizing the opposite conductivity types for all of the appropriate doped regions.

For the purpose of this disclosure, it is further appreciated that a "high voltage" is defined as a voltage that is substantially 150 V or greater, a "medium voltage" is defined between 150 V and 50 V, and a "low voltage" is defined to be 12 V or less.

In one embodiment, a power switch is a high voltage field effect transistor (HVFET) illustrated as an N-channel metal oxide semiconductor field-effect transistor (MOSFET) with the high-voltage being supported between the source and drain regions. In other embodiments, a power switch may comprise a bipolar junction transistor (BJT), an insulated gate field effect transistor (IGFET), or other device structures that provide a transistor function.

For purposes of this disclosure, "ground" or "ground potential" refers to a reference voltage or potential against which all other voltages or potentials of a circuit or IC are defined or measured. A "terminal" provides a point of external electrical connection to an IC device or package, thereby allowing external components, circuits, signals, power, loads, etc., to be coupled to the internal components and circuitry of a high voltage IC.

Figure 1:
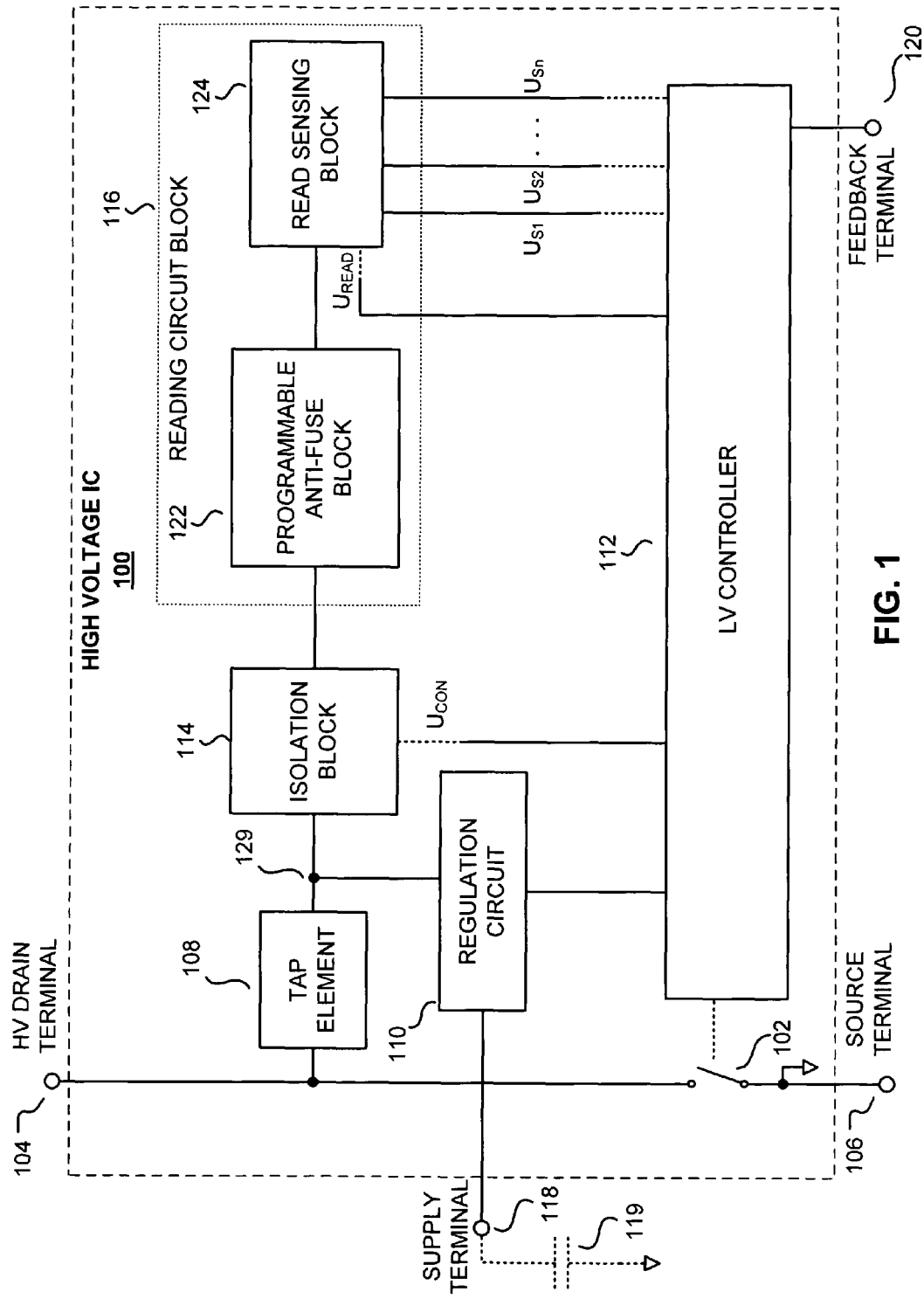
FIG. 1 illustrates an example block diagram of a high voltage IC device that includes a reading circuit block.

FIG. 1 is a block diagram illustrating an example high voltage IC 100 which includes a high voltage (HV) switch 102, a high-voltage (HV) drain terminal 104, a source terminal 106, a tap element 108, a regulation circuit 110, a low voltage (LV) controller 112, an isolation block 114, a reading (trimming) circuit block 116, a supply terminal 118, and a feedback terminal 120. As shown, high voltage switch 102 is coupled between HV drain terminal 104 and source terminal 106, which, in one embodiment, comprises a high-voltage field-effect transistor (HVFET). By way of example, high voltage switch 102 may be used in a power supply to control the current through the primary winding of a transformer. In operation, HV drain terminal 104 is typically coupled to receive input from an external circuit (not shown). As further shown, a source terminal 106 is coupled to one node or terminal of HV switch 102; the other terminal being coupled to HV drain terminal 104.

Tap element 108 is coupled to HV drain terminal 104. Tap element 108 functions as a buffer between HV drain terminal 104 and internal circuitry coupled to node 129 in high voltage IC 100 that is rated for relatively low voltages. In one embodiment, tap element 108 comprises a three terminal (i.e., electrode) transistor device structure in which a voltage at a first (tap) terminal is substantially proportional to an applied voltage across the second and third terminals when the applied voltage is less than a pinch-off voltage of the transistor device.

When the applied voltage across the second and third terminals exceeds the pinch-off voltage, the voltage provided at the tap terminal is substantially constant or unchanging with increased applied voltage. In one embodiment, tap element 108 comprises a junction field-effect transistor (JFET). In operation, tap element 108 provides a buffer between HV terminal 104 and internal circuitry in high voltage IC that is rated for much lower voltages. For example, during normal operation HV terminal 104 may be exposed to voltage in excess of 550 V, whereas the voltage appearing at node 129 (maximum voltage exposed to the internal circuitry of high voltage IC 100) may be limited to no more than 80 V.

As shown, reading circuit block 116 is coupled to node 129 through isolation block 114. In operation, reading circuit block 116 is utilized to read the state of a plurality of anti-fuse elements in programmable anti-fuse block 122 after a trimming operation. Trimming involves selectively shorting selected ones of the anti-fuses to adjust one or more parameters of the high voltage IC. For example, trimming may be performed on high voltage IC 100 to assure performance meets certain defined specifications. In other words, trimming is a process of writing or programming selected anti-fuses to set certain operating characteristics of high voltage IC 100.

After trimming, reading circuit block 116 may be utilized to determine (i.e., read) the state of each anti-fuse element in programmable anti-fuse block 122. As shown, reading circuit block 116 includes programmable anti-fuse block 122, and a read sensing block 124. In one embodiment, programmable anti-fuse block 122 comprises of a series or array of anti-fuse elements. As described herein, an anti-fuse is a circuit element that provides a normally 'open' or substantially non-conducting electrical connection in a device structure like that of a capacitor, with two or more layers of metal, polysilicon, or doped semiconductor material separated by a dielectric layer (e.g., oxide, nitride, etc.). The electrical connection between the two layers can be permanently closed by applying a large voltage across the conductors which breaks down or destroys the dielectric layer, thereby electrically shorting the two layers. In a trimming operation, programmable anti-fuse block 122 may be programmable through the HV drain terminal 104.

As shown, anti-fuse programming block 122 is coupled to read sensing block 122, which, in turn, is coupled to low-voltage (LV) controller 112. During a reading operation, a voltage is applied to programmable anti-fuse block 122 such that one or more anti-fuse elements receive a low voltage. In one example, the voltage received by programmable anti-fuse block during the read cycle is substantially less (e.g., 10 V) than the voltage required to short an anti-fuse. A low voltage is used during reading to avoid inadvertently shorting any additional anti-fuses. During reading operation, the anti-fuses in programmable anti-fuse block 122 that are shorted or trimmed are in a conducting state that allows current to flow between two terminals of the anti-fuse. In one embodiment, read sensing block 124 detects the anti-fuses of programmable anti-fuse block 122 that are shorted. As shown, a read signal $U_{READ}$ is generated by LV controller 112 to initiate a reading operation in read sensing block 124. In one example, the read operation reads the state of each of the anti-fuse elements in programmable anti-fuse block 122.

In one embodiment, a reading operation is initiated when isolation block 114 is activated or turned "on", thereby coupling the voltage appearing at node 129 to programmable anti-fuse block 122 of reading circuit block 116. In this manner read sensing block 124 may read the state (i.e., trimmed or not trimmed) of each anti-fuse element of block 122. In operation, read sensing block 124 outputs state signals $U_{S1}$-$U_{Sn}$, wherein each state signal corresponds to an individual anti-fuse of block 122.

In one example, a reading operation is performed during start up of high voltage IC 100. After the state signals $U_{S1}$-$U_{Sn}$ have been output to LV controller 112, isolation block 114 is deactivated (i.e., switched "off"), thereby isolating reading circuit block 116 from node 129. This prevents any of the anti-fuses in programmable anti-fuse block 122 from being shorted during a normal operation of high voltage IC 100.

As shown, regulation circuit 110 is coupled to node 129, LV controller 112, and supply terminal 118. In operation, supply terminal 118 may be coupled to an external supply capacitor 119 that supplies power to internal circuitry of high voltage IC 100. During a start-up condition of high voltage IC 100, HV drain terminal 104 may be used to charge external capacitor 119 via tap element 108 and regulation circuit 110. In one example, during a start up condition of high voltage IC 100, external capacitor 119 is charged to a minimum voltage in order to begin operating the internal circuitry in high voltage IC 100. The minimum voltage needed for operation may be a value determined based on the minimum operating voltage for proper functioning of internal circuitry in high voltage IC 100. In normal operation, regulation circuit 110 may regulate a voltage (received from supply terminal 118) to power internal circuitry of high voltage IC 100.

During start-up of high voltage IC 100, regulation circuit 110 may shunt current from node 129 to charge up external capacitor 119. When current is being drawn from node 129, the voltage at node 129 is limited to substantially the voltage across capacitor 119. In one example, when current is drawn from node 129 the voltage at node 129 drops to a low voltage suitable to use for reading circuit block 116. Once node 129 is at a low voltage, isolation block 114 may be activated to couple the low voltage to reading circuit block 116. As described above, this voltage potential is utilized to read the state of each of the anti-fuses in block 122. It is appreciated that the voltage at node 129 is dropped to a low voltage before node 129 is coupled to read circuit block 116 (through isolation block 114) to prevent inadvertent trimming of anti-fuses in programmable anti-fuse block 122.

Figure 2:
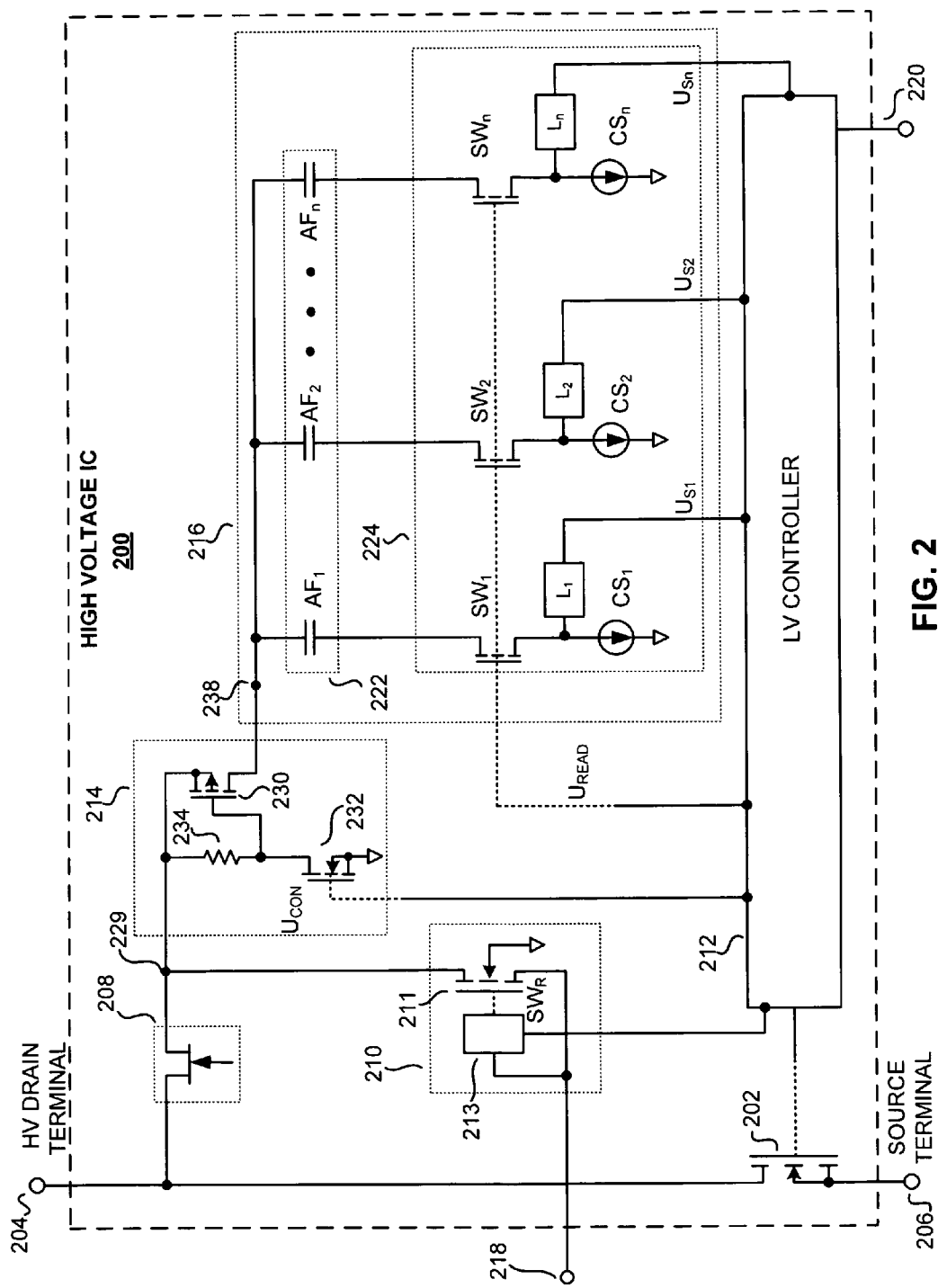
FIG. 2 illustrates an example detailed circuit schematic diagram of a high voltage IC device that includes a reading circuit block.

FIG. 2 illustrates an example high voltage IC 200 which includes a HV switch 202, a HV drain terminal 204, a source terminal 206, a tap element 208, a regulation circuit 210, a LV controller 212, an isolation block 214, a reading (trimming) block 216, a supply terminal 218, a feedback terminal 220, a programmable anti-fuse block 222 and a read sensing block 224. In one example, HV switch 202, tap element 208, regulation circuit 210, LV controller 212, isolation block 214, reading block 216, and read sensing block 224 may be examples of HV switch 102, tap element 108, regulation circuit 110, LV controller 112, isolation block 114, reading circuit block 116, and read sensing block 124, respectively, of FIG. 1.

As shown, regulation circuit 210 includes a shunt switch 211 (labeled $SW_R$) and a regulator 213. During normal operation of high voltage IC 200, regulation circuit 210 regulates the voltage at supply terminal 218 via switching shunt switch 211. More specifically, shunt switch 211 is switched to shunt current from node 229 to regulate the voltage at supply terminal 218. During start-up of high voltage IC 200, shunt switch 211 is on and an external capacitor (not shown) is charged.

During start-up, the voltage at node 229 is a low voltage due to the shunting of current to charge the external capacitor. During this time, node 229 may be coupled to node 238 through isolation block 214 to allow a reading operation in which the states of each of the anti-fuses is determined and communicated to LV controller 212. During reading, all of the anti-fuse elements ($AF_1$-$AF_N$) are exposed to a small voltage (provided at node 238) to detect the state of each anti-fuse element. In this manner, a reading operation is preformed when shunt switch 211 is turned on (i.e., shunting current), which generates the low voltage at node 229 used for reading.

In one embodiment, each anti-fuse element comprises a device structure that includes a tiny (~10 µm²) thin (e.g., 100-200 Å) oxide capacitor having a first terminal or electrode (e.g., aluminum, tungsten alloy, or other metals) which connects to a drain region of a corresponding switching transistor (e.g., $AF_1$ connects with the drain of $SW_1$). A second terminal or electrode (e.g., polysilicon) of the capacitor is separated from the drain region by a thin gate oxide layer. The second terminal is coupled to node 238 in HV IC 200. Practitioners in the art will appreciate that the amount of current required to trim each anti-fuse element is significantly smaller as compared to existing zener diodes, which normally require >150 mA. Persons of skill in the art will further understand that the anti-fuse element disclosed herein may reduce the overall size of the trimming block of a power IC device by a factor of about five or more as compared to prior art designs.

During normal operating conditions, isolation block 214 isolates reading circuit block 216 (coupled at node 238) from the voltage appearing at a node 229. Node 229 comprises a first or "tap" terminal of tap element 208. A second terminal of tap element 208 is coupled to HV drain terminal 204, which is also coupled to the drain of high voltage switch 202. A third terminal, which is coupled to the gate of the JFET tap transistor structure, is normally grounded.

Persons of skill in the semiconductor arts will appreciate that tap element 208 and high voltage switch 202 may be integrated into a single device structure. It is also appreciated that reading circuit block 216 and LV controller 212 are typically fabricated on the same piece of silicon material.

Isolation block 214 is shown including a PMOS transistor 230 coupled to a NMOS level shift transistor 232 and a level shift resistor 234. Node 229 is coupled to the source of transistor 230 and to one end of resistor 234. The other end of resistor 234 is coupled to the gate of transistor 230 and to the drain of level shift transistor 232. The source of transistor 232 is coupled to ground. The gate of transistor 232 is coupled to receive a signal $U_{CON}$ generated by LV controller 212.

Practitioners will appreciate that transistor 230 of isolation block 214 functions to isolate reading circuit block 216 from high voltage produced by tap element 208 at node 229 under normal operating conditions. In one embodiment, PMOS transistor 230 may be rated up to 80 V.

As configured, transistor 232 and resistor 234 operate to level shift the gate control signal of transistor 230. Activation of signal $U_{CON}$ turns on transistor 232, which, in turn, turns on transistor 230, thereby coupling node 229 to 238. In operation, LV controller 212 activates signal $U_{CON}$ to connect node 229 to 238 when voltage at node 229 is a low voltage, such as during as start-up condition of high voltage IC 200. Conversely, LV controller 212 may deactivate signal $U_{CON}$ to disconnect node 229 from node 238 after the reading operation is completed. In one implementation, the current through level shift transistor 232 and resistor 234 may be set such that when the transistor 232 is turned on, the gate-to-source voltage of transistor 230 is limited to about 10 V. In certain embodiments, the gate of level shift transistor 232 may be clamped.

As shown, reading circuit block 216 further includes programmable anti-fuse block 222 and read sensing block 224. As shown, programmable anti-fuse block 222 comprises multiple programmable anti-fuse elements ($AF_1$-$AF_n$, where n is an integer). Each anti-fuse element is coupled between node 238 and a corresponding sensing switch ($SW_1$-$SW_n$, where n is an integer) of read sensing block 224. Prior to programming (i.e., trimming) a selected anti-fuse does not pass any current; that is, it appears as an open circuit to a normal D.C. operating voltage (e.g., VDD=5-6 V).

A selected anti-fuse in reading circuit block 216 may be read by turning on the corresponding selector switch in block 224 and then applying an appropriate voltage (e.g., a low voltage) at node 238. It is appreciated that the voltage required to blow a selected anti-fuse depends on the gate oxide thickness; for a typical oxide thickness, about 30 V. Application of a voltage near (or above) a breakdown voltage of the anti-fuse element AF can cause the gate oxide of the anti-fuse structure to rupture, resulting in a permanent short between the top and bottom capacitive plates of the anti-fuse $AF_1$, with a resistance typically on the order of a few thousand ohms. The state of each anti-fuse element may be read by sensing its resistance using read sensing block 224.

As shown, read sensing block 224 comprises multiple programmable sensing switches $SW_1$-$SW_n$. In one embodiment, sensing switches SW comprise MOSFETS that may withstand up to 80 V. Read sensing block 224 also comprises multiple current sources $CS_1$-$CS_n$, where n is an integer, coupled to a corresponding sensing switch SW. In operation, each of the current sources CS sinks current. During a reading operation, LV controller 212 outputs a read signal $U_{READ}$ that switches on each of the sensing switches $SW_1$-$SW_n$. Once an anti-fuse element has been shorted, the drain of the corresponding sensing switch SW is raised to substantially the same voltage potential as node 238.

Read sensing block 124 further includes multiple latches $L_1$-$L_n$, where n is an integer. In operation, each of the latches receives a high or low signal depending on the voltage at the source of its corresponding sensing switch SW. For example, if anti-fuse $AF_1$ is shorted, during the read cycle when a voltage is applied to node 238 and sensing switch $SW_1$ is switched on, the source of sensing switch $SW_1$ is high; therefore latch $L_1$ outputs a high signal to LV controller 212. In this manner, read sensing block 224 determines the state of each anti-fuse element AF.

It should be understood that high voltage switch 202, which in one embodiment is a MOSFET, is designed and fabricated to withstand a high pulsed voltage up to approximately 700 V. In one implementation high voltage IC 200 is used in a switch mode power supply and high voltage switch 202 regulates the transfer of energy by limiting a current through the primary winding of a coupled inductor or a transformer.

Figure 3:
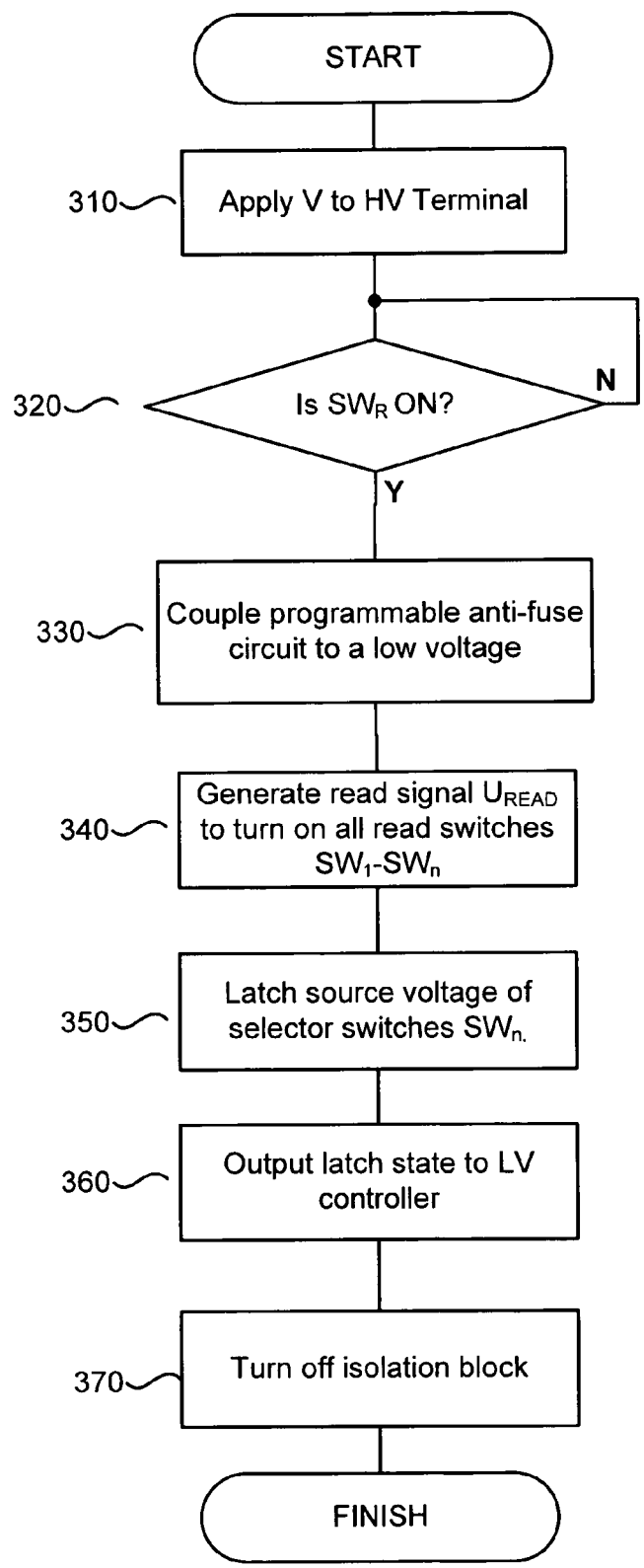
FIG. 3 is an example flow diagram of an operation for reading one or more anti-fuse elements.

FIG. 3 is an example flow diagram of an operation for reading one or more anti-fuse elements in a high-voltage IC. The method of FIG. 3 begins with the application of a voltage potential (e.g., 500 V or higher) to the HV drain terminal of the high-voltage IC (block 310). Next, at decision block 320, a determination is made whether the shunt switch ($SW_R$) of the regulator circuit is turned on (block 320). For example, this determination may be made by checking that the voltage potential at node 218 of the FIG. 2 (connected to an external capacitor) has risen above a certain voltage level. As explained above, when shunt switch $SW_R$ is turned on, the voltage at the tap terminal (node 229 in FIG. 2) is a low voltage due to the shunting of current to charge the external capacitor.

Once shunt switch $SW_R$ has turned on, the low voltage provided at tap terminal may be coupled to the programmable anti-fuse block (block 330). This may be accomplished by activating or turning on isolation block 214. For instance, the LV controller may output signal $U_{CON}$ to turn on transistors 232 & 230 of the isolation block, thereby coupling the low voltage appearing at the tap terminal to node 238 of the programmable anti-fuse block.

Next, the read signal $U_{READ}$ is generated by LV controller to turn on all of the read selector switches ($SW_1$-$SW_n$) of the read sensing block (block 340). With the read selector switches all turned on, the source voltage of each selector switch is latched in corresponding latches $L_1$-$L_n$ (block 350), thereby latching (i.e., storing) the programmed state of the anti-fuse block. This state is then output from the read sensing block to the LV controller (block 360) as a set of high or low signals, each signal line or bit corresponding to the programmed state of an individual anti-fuse. After the programmed state of the anti-fuse block has been received by the LV controller, the isolation block is turned off, thereby decoupling the programmable anti-fuse block from the tap terminal (block 370). At this point, the high-voltage IC may commence normal operation.

Although the present invention has been described in conjunction with specific embodiments, those of ordinary skill in the arts will appreciate that numerous modifications and alterations are well within the scope of the present invention. Accordingly, the specification and drawings are to be regarded in an illustrative rather than a restrictive sense.

We claim:

1. A method for reading a programmable anti-fuse block of a power integrated circuit (IC) comprising:
   applying a first voltage to a first pin of the power IC, the first pin being coupled to circuitry that lowers the first voltage to a second voltage at a first node;
   coupling the second voltage to a common node of the programmable anti-fuse block, the common node being coupled to a plurality of anti-fuses, each anti-fuse having a programmed state;
   generating a read signal that turns on a plurality of selector switches, each selector switch being coupled to a corresponding one of the anti-fuses; and
   latching a voltage potential at a second node of each selector switch, the voltage potential being representative of the programmed state of each anti-fuse.

2. The method of claim 1 further comprising reading the latched programmed state of each anti-fuse by a controller of the power IC.

3. The method of claim 1 further comprising decoupling the programmable anti-fuse block from the first node.

4. The method of claim 1 wherein each selector switch comprises a field-effect transistor (FET) having a drain coupled to a corresponding one of the anti-fuses, each selector switch also having a gate and a source.

5. The method of claim 1 wherein the first pin is also coupled to a drain of a high-voltage field-effect transistor (HVFET) of the power IC.

6. The method of claim 1 wherein the circuitry comprises a tap transistor element.

7. The method of claim 1 wherein the circuitry comprises a level shift transistor.

8. The method of claim 1 wherein the read signal is generated by the controller.

9. A method for reading a programmable anti-fuse block of a power integrated circuit (IC) comprising:
   lowering a first voltage externally applied to a first pin of the power IC to a second voltage provided at a first internal node, the second voltage being substantially less than the first voltage;
   activating a circuit block to couple the second voltage appearing at the first node to a common node of the programmable anti-fuse block, the common node being coupled to a plurality of anti-fuses, each anti-fuse having a programmed state; and
   generating a read signal that causes a voltage potential representative of the programmed state of each anti-fuse to be latched into a corresponding latch element.

10. The method of claim 9 wherein the lowering of the first voltage to the second voltage comprises shunting current from the first node.

11. The method of claim 9 wherein the first pin is coupled to a drain of a high-voltage field-effect transistor (HVFET) and to a first terminal of a tap element, the tap element also having a second terminal coupled to a first internal node.

12. The method of claim 9 further comprising outputting the programmed state of each anti-fuse from each corresponding latch element to a controller of the power IC.

13. The method of claim 9 wherein the controller is a low-voltage (LV) controller, and further wherein the read signal is generated by the LV controller.

14. The method of claim 9 further comprising deactivating the circuit block, thereby decoupling the common node of the programmable anti-fuse block from the first internal node.

15. The method of claim 9 wherein the first voltage is substantially 150 V or greater.

* * * * *